United States Patent
Mihajlovic et al.

(10) Patent No.: US 10,056,430 B1
(45) Date of Patent: Aug. 21, 2018

(54) MRAM WITH VOLTAGE DEPENDENT IN-PLANE MAGNETIC ANISOTROPY

(71) Applicant: SanDisk Technologies LLC, Plano, TX (US)

(72) Inventors: Goran Mihajlovic, San Jose, CA (US); Jordan Katine, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/793,910

(22) Filed: Oct. 25, 2017

(51) Int. Cl.
| | |
|---|---|
| *H01L 27/22* | (2006.01) |
| *G11C 11/16* | (2006.01) |
| *H01L 43/02* | (2006.01) |
| *H01L 43/08* | (2006.01) |
| *H01L 43/10* | (2006.01) |
| *H01L 29/82* | (2006.01) |
| *H01L 27/24* | (2006.01) |

(52) U.S. Cl.
CPC .......... *H01L 27/222* (2013.01); *G11C 11/161* (2013.01); *H01L 27/24* (2013.01); *H01L 29/82* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 6,252,796 B1 * | 6/2001 | Lenssen ................. | B82Y 10/00 365/171 |
| 7,075,760 B2 | 7/2006 | Gill | |
| 9,159,908 B2 | 10/2015 | Cao et al. | |
| 2005/0068683 A1 * | 3/2005 | Gill ........................ | B82Y 10/00 360/314 |
| 2007/0097731 A1 * | 5/2007 | Abraham ............ | G11C 11/1675 365/158 |
| 2015/0129995 A1 | 5/2015 | Wang et al. | |

FOREIGN PATENT DOCUMENTS

WO 2016209226 A1 12/2016

OTHER PUBLICATIONS

Zhang, et al., Spin transfer torques in permalloy on monolayer MoS2, APL Materials, American Institute of Physics, http://aip.scitation.org/doi/pdf/10.1063/1.4943076, 2016.

Li, et al., Thermally stable voltage-controlled perpendicular magnetic anisotropy in Mo|CoFeB|MgO structures, Applied Physics Letters, AIP Publishing, http://drl.ee.ucla.edu/wp-content/uploads/2017/07/Thermally-stable-voltage-controlled-perpendicular-magnetic-anisotropy-in-MoCoFeBMgO-structures.pdf , 2015.

* cited by examiner

*Primary Examiner* — Karen Kusumakar
(74) *Attorney, Agent, or Firm* — Kunzler, PC

(57) ABSTRACT

Apparatuses, systems, and methods are disclosed for magnetoresistive random access memory. A magnetic tunnel junction for storing data may include a fixed layer, a barrier layer, and a composite free layer. A barrier layer may be disposed between a fixed layer and a composite free layer. A composite free layer may include one or more ferromagnetic layers. A composite free layer may include one or more anisotropy inducer layers that induce an in-plane magnetic anisotropy for the composite free layer in response to a perpendicular bias voltage.

20 Claims, 6 Drawing Sheets

MRAM WITH VOLTAGE DEPENDENT IN-PLANE MAGNETIC ANISOTROPY

TECHNICAL FIELD

The present disclosure, in various embodiments, relates to magnetoresistive random access memory and more particularly relates to a cross-point architecture for spin accumulation torque magnetoresistive random access memory.

BACKGROUND

Various types of magnetoresistive random access memory (MRAM) store data using magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0," Alternatively, a low resistance may correspond to a binary "0" and a high resistance may correspond to a binary "1.

As storage capacities increase and MTJ feature sizes decrease, decreasing the volume of an MTJ may decrease the thermal stability of the free layer's magnetic moment. Decreased thermal stability may result in poor data retention and increased error rates. However, increasing the thermal stability of an MTJ's free layer in other ways to compensate for the decreased volume may also increase the write voltage used to set the free layer into the parallel or anti-parallel state. In various types of MTJs, configuring a free layer so that it is not easily switched into a different state by thermal energy fluctuations may also involve increasing the energy it takes to deliberately switch between states.

SUMMARY

Apparatuses are presented for magnetoresistive random access memory. In one embodiment, a magnetic tunnel junction for storing data includes a fixed layer, a barrier layer, and a composite free layer. In a certain embodiment, a barrier layer is disposed between a fixed layer and a composite free layer. In a further embodiment, a composite free layer includes one or more ferromagnetic layers. In some embodiments, a composite free layer includes one or more anisotropy inducer layers that induce an in-plane magnetic anisotropy for the composite free layer in response to a perpendicular bias voltage.

Systems are presented for magnetoresistive random access memory. In one embodiment, a magnetoresistive random access memory (MRAM) die includes a plurality of memory cells. In a certain embodiment, memory cells include a reference layer, a barrier layer, and a composite free layer. In a further embodiment, a barrier layer is disposed between a reference layer and a composite free layer. In certain embodiments, a composite free layer includes one or more ferromagnetic layers. In further embodiments, a composite free layer includes one or more anisotropy inducer layers alternating with the one or more ferromagnetic layers. In one embodiment, one or more anisotropy inducer layers are configured to induce an in-plane magnetic anisotropy for a composite free layer in response to a perpendicular write current.

An apparatus, in another embodiment, includes means for storing data in a composite free layer for a magnetic tunnel junction, based on an orientation of a perpendicular magnetic moment for the composite free layer. In a certain embodiment, an apparatus includes means for symmetrically inducing an in-plane magnetic anisotropy for a composite free layer in response to positive and negative values of a perpendicular bias voltage.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
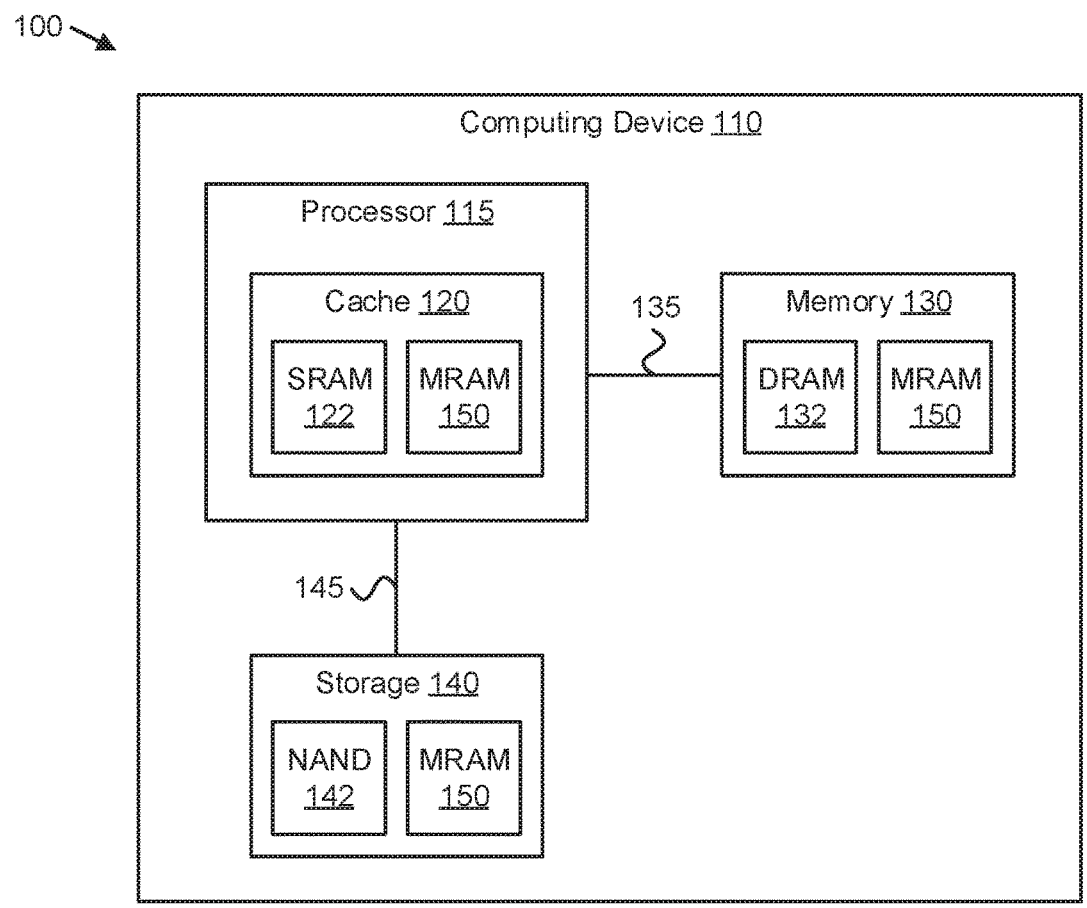
FIG. 1 is a schematic block diagram of one embodiment of a system comprising magnetoresistive random access memory (MRAM)

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts a system 100 comprising magnetoresistive random access memory (MRAM) 150. In the depicted embodiment, the system includes a computing device 110. In various embodiments, a computing device 110 may refer to any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may refer to any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, magnetoresistive random access memory (MRAM) 150, or the like. For example, in one embodiment, a cache 120 may include SRAM 122. In another embodiment, a cache 120 may include MRAM 150. In a certain embodiment, a cache 120 may include a combination of SRAM 122, MRAM 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, MRAM 150, or the like. For example, in one embodiment, a memory 130 may include DRAM 132. In another embodiment, a memory 130 may include MRAM 150. In a certain embodiment, a memory 130 may include a combination of DRAM 132, MRAM 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, MRAM 150, or the like. For example, in one embodiment, a storage 140 may include NAND flash memory 142. In another embodiment, a storage 140 may include MRAM 150. In a certain embodiment, a storage 140 may include a combination of NAND flash memory 142, MRAM 150, and/or other storage media types.

In various embodiments, MRAM 150 may be used to store data in a cache 120, memory 130, storage 140, and/or another component that stores data. For example, in the depicted embodiment, the computing device 110 includes MRAM 150 in the cache 120, memory 130, and storage 140. In another embodiment, a computing device 110 may use MRAM 150 for memory 130, and may use other types of memory or storage media for cache 120 or storage 140. Conversely, in another embodiment, a computing device 110 may use MRAM 150 for storage 140, and may use other types of memory media for cache 120 and memory 130. Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of MRAM 150 for cache 120, memory 130, storage 140, and/or other applications will be clear in view of this disclosure.

In various embodiments, the MRAM 150 may include one or more chips, packages, die, or other integrated circuit devices comprising magnetoresistive memory, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the MRAM 150. The MRAM 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The MRAM 150, in various embodiments, may include one or more MRAM dies, including a plurality of memory cells for storing data. In certain embodiments, the memory cells may be magnetic tunnel junctions (MTJs) where an MTJ includes a fixed layer, a barrier layer, and a composite free layer. The barrier layer may be disposed between the reference layer and the composite free layer. In one embodiment, the composite free layer include one or more ferromagnetic layers, and one or more anisotropy inducer layers. An anisotropy inducer layer may be configured to induce an in-plane magnetic anisotropy for the composite free layer in response to a perpendicular write current, a perpendicular bias voltage, or the like. In certain embodiments, inducing an in-plane magnetic anisotropy for a composite free layer in response to the write current or the bias voltage may allow a perpendicular MTJ to provide reduced switching voltage and/or switching current (in comparison to an MTJ without anisotropy inducer layers), while still providing high thermal stability. MRAM 150 is described in further detail below with regard to FIGS. 2 through 6.

Figure 2:
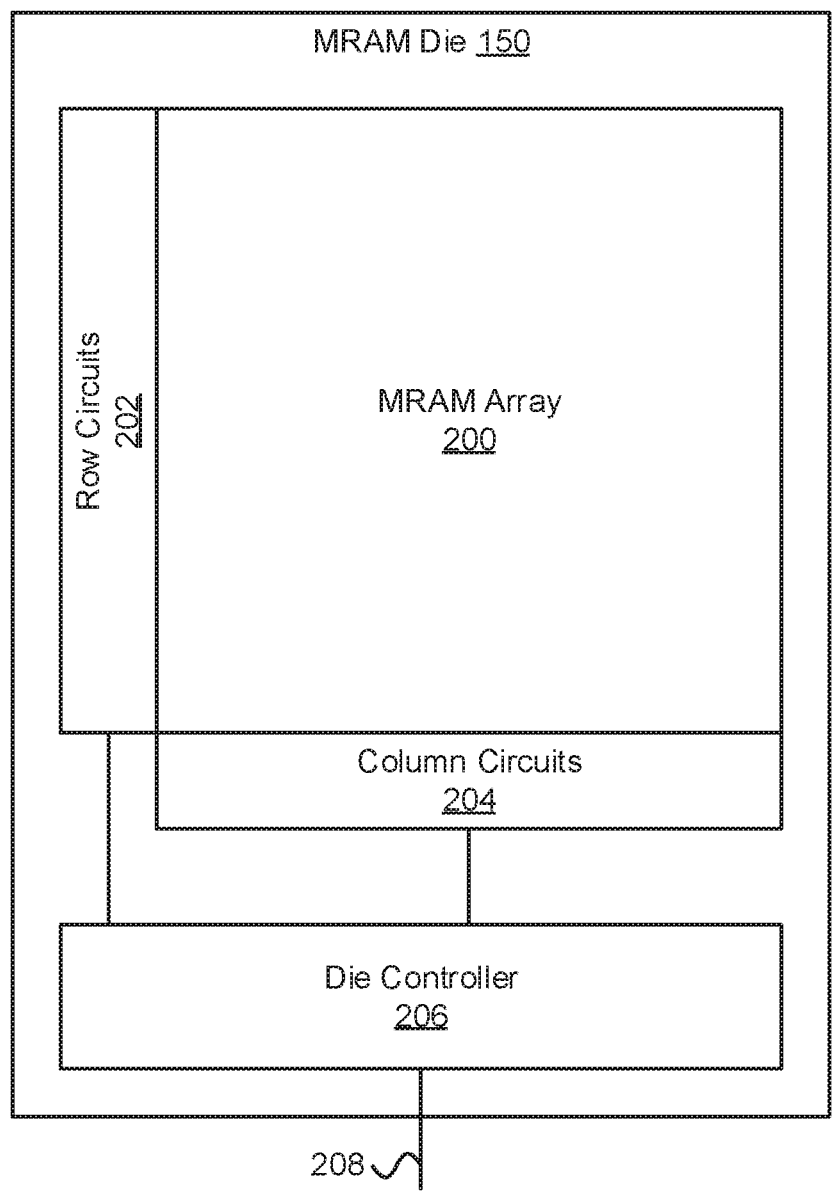
FIG. 2 is a schematic block diagram illustrating one embodiment of an MRAM die.

FIG. 2 depicts one embodiment of an MRAM die 150. The MRAM die 150 may be substantially similar to the MRAM 150 described with reference to FIG. 1. The MRAM die 150, in the depicted embodiment, includes an array 200 of MRAM cells, row circuits 202, column circuits 204, and a die controller 206.

In various embodiments, an MRAM die 150 may refer to an integrated circuit that includes both a core array 200 of memory cells (e.g., including MTJs) for magnetoresistive data storage, and peripheral components (e.g., row circuits 202, column circuits 204, and/or die controller 206) for communicating with the array 200. In certain embodiments, one or more MRAM die 150 may be included in a memory module, a storage device, or the like.

In the depicted embodiment, the array 200 includes a plurality of MRAM memory cells for storing data. In one embodiment, the array 200 may be a two-dimensional array. In another embodiment, the array 200 may be a three-dimensional array that includes multiple planes and/or layers of MRAM cells. In various embodiments, the array 200 may be addressable by rows via row circuits 202, and by columns via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via line 208, to receive command and address information, transfer data, or the like.

Figure 3:
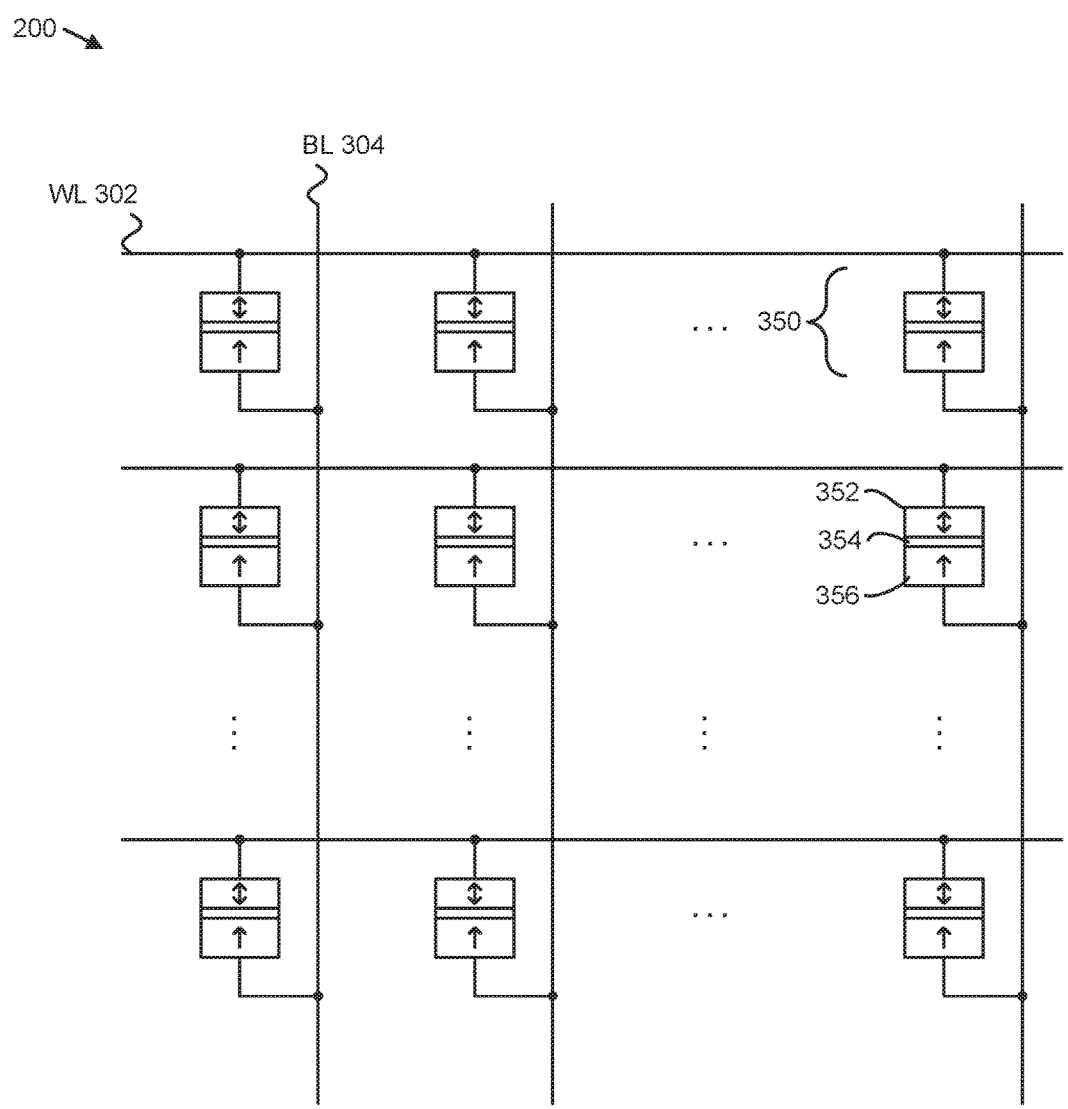
FIG. 3 is a schematic block diagram illustrating one embodiment of an MRAM array.

FIG. 3 depicts one embodiment of an MRAM array 200. The MRAM array 200 may be substantially similar to the MRAM array 200 described with reference to FIG. 2. In the depicted embodiment, the MRAM array 200 includes a plurality of memory cells 350 for storing data, coupled to word lines 302 and bit lines 304.

A memory cell 350, in the depicted embodiment, includes a fixed layer 356 (also referred to as a pinned layer or reference layer) with a fixed or pinned magnetic moment, indicated by a single-headed arrow. In a further embodiment, a memory cell 350 includes a free layer 352 (also referred to as a storage layer), with a magnetic moment that can be changed or switched, indicated by a double-headed arrow. A thin dielectric or barrier layer 354 may separate the fixed layer 356 and the free layer 352, and current may flow across the barrier layer 354 due to quantum tunneling. The probability of an electron tunneling through the barrier layer 354 is higher if the magnetic moments of the fixed layer 356 and the free layer 352 are substantially parallel to each other (referred to herein as the parallel state for the memory cell 350), and lower if the magnetic moments of the fixed layer 356 and the free layer 352 are substantially antiparallel to each other (referred to herein as the antiparallel state for the memory cell 350). Therefore, an electrical resistance through the memory cell 350 may be higher in the antiparallel state than in the parallel state.

In various embodiments, a difference in resistance between parallel and antiparallel states of a memory cell 350 allows data to be stored. For example, a low resistance may correspond to a binary "1" and a high resistance may correspond to a binary "0," Alternatively, a low resistance may correspond to a binary "0" and a high resistance may correspond to a binary "1."

In certain embodiments, the memory cell 350 may be an MTJ as described below with reference to FIGS. 4 and 5, and the free layer 352 may be a composite free layer. In the depicted embodiment, the memory cell 350 is a spin-transfer torque (STT) MTJ. In various embodiments, an STT-MTJ stores data based on the magnetic moment of the free layer 352, and the magnetic moment of the free layer 352 is switchable (e.g., between parallel and antiparallel states by passing a write current through the fixed layer 356 and the free layer 352. For example, electrons in a write current passing through a memory cell 350 (e.g., between a word line 302 and a bit line 304) may be spin-polarized by the fixed layer 356, and the spin-polarized current may exert a torque on the magnetic moment of the free layer 352, to put the memory cell 350 into the parallel or antiparallel state. Current in one direction may set the memory cell 350 into the parallel state, and current in the opposite direction may set the memory cell 350 into the antiparallel state.

In general, in various embodiments, a word line 302 or a bit line 304 may be a conductor such as a metal or polysilicon conductor, that conducts electrical current to or from a memory cell 350. In FIG. 3, the MRAM array 200 is depicted with a small number of memory cells 350 for illustrative purposes, and with a correspondingly small number of word lines 302 and bit lines 304. However, in various embodiments, an actual array may include many more cells 350, word lines 302, and bit lines 304 than are depicted in FIG. 3. For example, a gigabyte of MRAM memory may include billions of memory cells 350. Similarly, in the depicted embodiment, the MRAM array 200 is a two-dimensional array, but in another embodiment, cells 350, word lines 302, and bit lines 304 may be stacked to form a three-dimensional array.

In certain embodiments, a controller, such as the die controller 206 of FIG. 2 may perform read operations and write operations for the array 200 by controlling voltages for the word lines 302 and the bit lines 304. A controller may include or communicate with voltage generating components such as voltage drivers, level shifters or the like, voltage switching components such as transistors for coupling voltages to lines, sensing components such as sense amplifiers, latches to store sense amplifier outputs, and the like. Peripheral circuits of the MRAM die 150, such as the row circuits 202, column circuits 204 and die controller 206 may bias the word lines 302 and the bit lines 304 (e.g., by coupling bias voltages to the word lines 302 and the bit lines 304) to supply the electrical currents for reading and for writing.

In various embodiments, word lines 302 and bit lines 304 are coupled to the memory cells 350 such that a voltage difference between a word line 302 and a bit line 304 results in a current through the memory cell 350 at the intersection of the word line 302 and the bit line 304. For example, in the depicted embodiment, word lines 302 are coupled to free layers 352 for rows of memory cells 350, and bit lines 304 are coupled to fixed layers 356 for columns of memory cells 350. In another embodiment, word lines 302 may be coupled to fixed layers 356, and bit lines 304 may be connected to free layers 352. Various ways to couple memory cells 350 to word lines 302 and bit lines 304 in an MRAM array 200 will be clear in view of this disclosure.

In certain embodiments, writing data to a memory cell 350 at the intersection of a selected word line 302 and a selected bit line 304 may include applying a program voltage to the selected word line 302, and a zero (or other reference) voltage to the selected bit line 304, so that electrical current through the memory cell 350 (e.g., tunneling current through the barrier layer 354) is spin-polarized by the fixed layer 356 for changing the magnetic moment of the free layer 352. In various embodiments, the MRAM array 200 may include transistors, selectors, or the like that prevent stray currents through non-selected memory cells 350 during write operations. For example, in one embodiment, voltages for the non-selected word lines 302 and the non-selected bit lines 304 may be set to half the program voltage, so that there is no voltage difference between the word line 302 and the bit line 304 for non-selected memory cells 350 (e.g., memory cells 350 that are not on the selected word line 302 or the selected bit line 304), and a voltage difference of half the program voltage between the word line 302 and the bit line 304 for half-selected memory cells 350 (e.g., memory cells 350 that are on either the selected word line 302 or the selected bit line 304, but not both). In a further embodiment, selectors for the memory cells 350 may not allow current to flow unless the voltage difference between the word line 302 and the bit line 304 is greater than half the program voltage. Thus, a selector, transistor, or other switching device may allow a write operation to alter stored data in one memory cell 350 without altering stored data values in other memory cells 350.

In another embodiment, data may be written to a row of memory cells 350 simultaneously. For example, the word line 302 for a row may be grounded, and positive or negative program voltages may be applied to the bit lines 304 to write different data values to the memory cells 350 in the row. Various ways of writing data to individual or multiple memory cells 350, in MRAM arrays 200 using various geometries, will be clear in view of this disclosure.

Reading data from a memory cell 350, in various embodiments, may include measuring, detecting, or sensing a resistance of the memory cell 350 (e.g., indicating whether the memory cell 350 is in a parallel or antiparallel state). For example, in one embodiment, a known voltage may be applied across the free layer 352, the barrier layer 354, and the fixed layer 356, and the resulting current may be measured or sensed to detect the resistance of the memory cell 350. In another embodiment, a known current may be applied through the memory cell 350, and the resulting voltage drop across the memory cell 350 may be measured or sensed to detect the resistance. In certain embodiments, an MRAM array 200 or MRAM die 150 may include sense amplifiers, latches, and the like, to convert a low power signal from a bit line 304 to a logic level representing a 1 or 0, and store the converted data.

In the depicted embodiment, the word lines 302 and the bit lines 304 are used to read data from the memory cells 350. For example, reading data from a memory cell 350 at the intersection of a selected word line 302 and a selected bit line 304 may include applying a read voltage to the selected word line 302, and a zero (or other reference) voltage to the selected bit line 304, so that the resistance through the memory cell 350 may be sensed. As described above for write operations, selectors, transistors, or the like may prevent stray currents through non-selected memory cells 350 during read operations. Additionally, data may be read from a row of memory cells 350 simultaneously. For example, a read voltage may be applied to a word line 302 for a row, and the bit lines 304 may be grounded, so that the resulting currents are sensed for multiple bit lines 304. Various ways of reading data from individual or multiple memory cells 350, in MRAM arrays 200 using various geometries, will be clear in view of this disclosure.

In certain embodiments, the read voltage or the read current may be lower than the write voltage or write current, so that current used to determine the state of a memory cell 350 is not sufficient to change the state of the memory cell 350. For example, current may be controlled at the word lines 302 or the bit lines 304 to prevent read currents from disturbing stored data. In another embodiment, data may be re-written to the memory cells 350 after reading, to correct data values in cells 350 where the state of the cell 350 was changed by the read current. Various ways of preventing errors due to read currents disturbing stored data will be clear in view of this disclosure.

Figure 4:
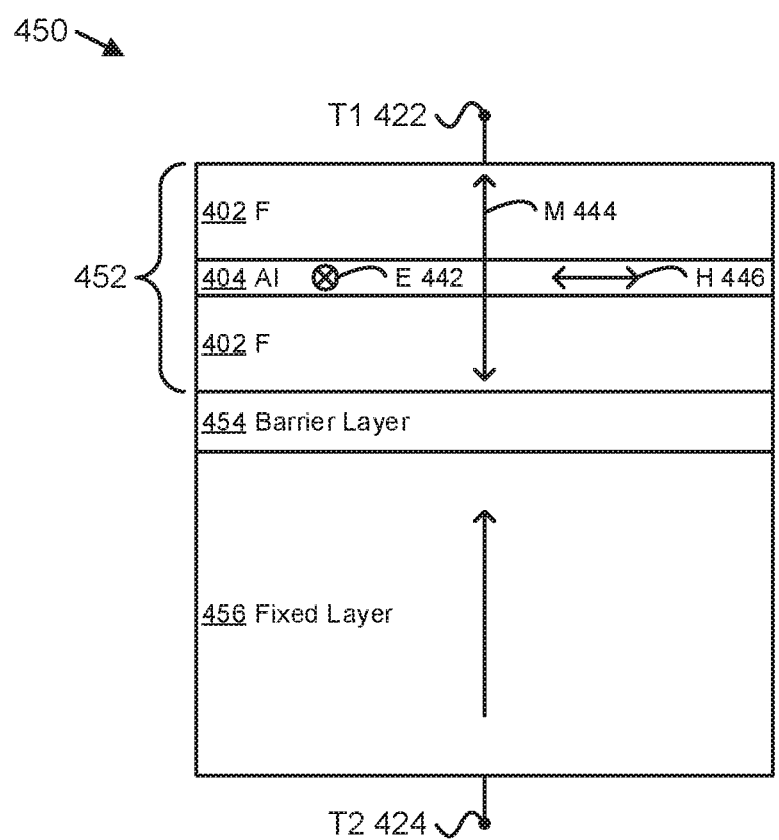
FIG. 4 is a schematic block diagram illustrating one embodiment of a magnetic tunnel junction comprising a composite free layer.

FIG. 4 depicts one embodiment of a magnetic tunnel junction 450. The magnetic tunnel junction 450, in various embodiments, may be substantially similar to the memory cell 350 described above with regard to FIG. 3. In the depicted embodiment, the MTJ 450 includes a free layer 452, a barrier layer 454, and a fixed layer 456, which may be substantially as described above with regard to FIG. 3. In the depicted embodiment, the free layer 452 is a composite free layer, comprising one or more ferromagnetic (F) layers 402 and one or more anisotropy inducer (AI) layers 404. In various embodiments, layers of the MTJ 450 may be formed or deposited by various techniques such as physical vapor deposition, sputtering, or the like. In certain embodiments, further layers not shown in FIG. 4, such as capping or seed layers, may be included in an MTJ 450, or in the process of making an MTJ 450.

Additionally, in the depicted embodiment, the MTJ 450 includes two terminals 422, 424. The terminals 422, 424 are depicted for convenience in discussing current flows, and may couple the MTJ 450 to word lines 302 and bit lines 304 as described above. In another embodiment, however, word lines 302 and bit lines 304 may be directly coupled to the fixed layer 456 and the free layer 452.

The fixed or reference layer 456, in one embodiment, includes a ferromagnetic material with a fixed or pinned magnetic moment. As used herein, the term "ferromagnetic" may be used to refer to any material capable of spontaneous magnetization (e.g., remaining magnetized in the absence of an externally applied magnetic field). Thus, a "ferromagnetic" material may refer to a strictly ferromagnetic material (e.g., for which individual microscopic magnetic moments are fully aligned), or to a ferrimagnetic material (e.g., for which individual microscopic magnetic moments are partially anti-aligned).

In various embodiments, a "fixed" or "pinned" magnetic moment refers to a magnetic moment that is substantially constant, at least in orientation, when the magnetic moment of the free layer 452 is changed or flipped. Thus, for example, in one embodiment, a fixed layer 456 may comprise a ferromagnetic material with a higher coercivity than a ferromagnetic material of a free layer 452. In another embodiment, a fixed layer 456 may comprise a ferromagnetic thin film with a magnetic moment pinned by exchange coupling with an antiferromagnet. For example, in one embodiment, a fixed layer 456 may include a synthetic antiferromagnet (e.g., a cobalt/iron and ruthenium multilayer), a ruthenium or iridium spacer, and a ferromagnetic layer comprising a cobalt/iron/boron alloy (CoFeB).

The magnetic moment of the fixed layer 456, in various embodiments, may provide a reference for the orientation of the magnetic moment of the free layer 452. For example, in various embodiments, the total magnetic moment of the free layer 452 may be parallel or antiparallel to the magnetic moment of the fixed layer 456. Accordingly, the fixed layer 456 is depicted with a reference magnetic moment indicated by a single-headed arrow, and the parallel or antiparallel magnetic moment of the free layer 452 is indicated by a double-headed arrow.

The barrier layer 454, in various embodiments, is disposed between the fixed or reference layer 456 and the free layer 452. In certain embodiments, the barrier layer 454 comprises a dielectric material, such as magnesium oxide (MgO). In certain embodiments, the barrier layer 454 may be less than 20 angstroms thick, so that quantum tunneling of electrons across the barrier layer 454 allows current to flow through the MTJ 450.

The free layer 452, in various embodiments, may be a composite free layer 452. A composite layer, as used herein, may refer to any layer that itself comprises a stack of layers. In various embodiments, a composite free layer 452 may include one or more ferromagnetic layers 402, and one or more anisotropy inducer layers 404. In certain embodiments, the ferromagnetic layers 402 may alternate with the anisotropy inducer layers 404. For example, an anisotropy inducer layer 404 may be between two ferromagnetic layers 402, or an anisotropy inducer layer 404 at the top or bottom of the composite free layer 452 may be adjacent to one ferromagnetic layer 402. Similarly, a ferromagnetic layer 402 may be between two anisotropy inducer layers 404, or a ferromagnetic layer 402 at the top or bottom of the composite free layer 452 may be adjacent to one anisotropy inducer layer 404.

The one or more ferromagnetic layers 402, in various embodiments, may include any ferromagnetic material with a magnetic moment that can be changed, switched, or flipped, relative to the magnetic moment of the fixed layer 456. In certain embodiments, the one or more ferromagnetic layers 402 may include a CoFeB alloy. In some embodiments, the one or more ferromagnetic layers 402 may include multilayers based on transition metals like cobalt and iron, and noble metals such as platinum, palladium, and gold. Some examples include cobalt/palladium, cobalt/platinum and cobalt/nickel.

In general, in various embodiments, the magnetic moment of the composite free layer 452 may be based on the magnetization of the ferromagnetic layers 402. In certain embodiments, a thickness of the anisotropy inducer layer(s) 404 may be configured so that exchange coupling between individual ferromagnetic layers 402 maintains uniform (or substantially uniform) magnetization across the set of ferromagnetic layers 402. Thus, in various embodiments, a set of one or more ferromagnetic layers 402 within a composite free layer 452 may have an overall persistent (but switchable) magnetic moment that allows the composite free layer 452 to store data.

In the depicted embodiment, the magnetic moments of the fixed layer 456 and the composite free layer 452 (including the magnetic moments of individual ferromagnetic layers 402) are perpendicular to the barrier layer 454. As used herein, terms such as "in-plane" and "perpendicular" may be used to describe a direction or orientation (e.g., for a vector quantity such as a magnetic moment, magnetization, magnetic field, electric field, current density, or the like), relative to a layer of an MTJ 450. In one embodiment, the term "perpendicular" refers to a direction at right angles to a surface of a layer (e.g., vertically in FIG. 4), and the term "in-plane" refers to a direction parallel to a surface of the layer (e.g., horizontally in FIG. 4). In another embodiment, however, a vector, orientation, or direction may include a combination of perpendicular and in-plane components, and may be described as either "perpendicular" or "in-plane" based on whether the perpendicular component or the in-plane component has a greater magnitude. For example, in one embodiment, where a magnetic moment includes non-zero in-plane and perpendicular components, it may nevertheless be described as an "in-plane" magnetic moment if the in-plane component is greater than the perpendicular component. Additionally, an MTJ 450 that stores data based on a perpendicular magnetic moment of the free layer 452 may be referred to as a perpendicular MTJ.

In certain embodiments, MTJs 450 may be susceptible to data errors if the magnetization of the free layer 452 is switched inadvertently by thermal fluctuations. If thermal energy fluctuations are larger than (or comparable to) the magnetic energy of the free layer 452, then inadvertent switching of the magnetization of the free layer 452 may be undesirably likely. Conversely, if thermal energy fluctuations are significantly smaller than the magnetic energy of the free layer 452, then inadvertent switching may be unlikely, and data may be stably stored. Thus, as used herein, a "thermal stability" for an MTJ 450 or memory cell 350 may refer to any measurement, statistic, or characteristic corresponding to the magnetic energy of the free layer 452, or to a barrier energy that separates the parallel and antiparallel states. For example, in one embodiment, a thermal stability factor may be the ratio of the barrier energy to kT, where T is the operating temperature and k is the Boltzmann constant. In general, in various embodiments, a thermal stability may correspond to data retention times: data retention times may be longer for MTJs 450 with higher thermal stability, and lower for MTJs 450 with lower thermal stability.

In certain embodiments, the magnetic energy for the free layer 452 of a perpendicular MTJ 450 may depend on the saturation magnetization of the free layer 452, the volume of the free layer 452, and the perpendicular magnetic anisotropy of the free layer 452. Thus, the magnetic energy and the thermal stability may be increased by increasing the saturation magnetization, the volume, and/or the perpendicular magnetic anisotropy of the free layer 452. Correspondingly, decreasing the saturation magnetization, the volume, and/or the perpendicular magnetic anisotropy of the free layer 452 may decrease the magnetic energy of the free layer 452, and the thermal stability of the MTJ 450. In certain embodiments, as storage capacities increase and MTJ sizes decrease, thermal stability for MTJs 450 may also decrease based on the decreasing volume of the MTJs 450. Compensating for the effects of the reduced volume, to maintain sufficient thermal stability for data retention, may involve increasing the saturation magnetization and/or the perpendicular magnetic anisotropy of the free layer 452. In certain embodiments, it may be impossible or impractical to significantly vary the saturation magnetization of the free layer 452. Thus, in certain embodiments, configuring the perpendicular magnetic anisotropy of the free layer 452 may be the more effective way to configure an MTJ 450 with a desired thermal stability.

In various embodiments, a magnetic anisotropy of the free layer 452 may refer to a difference between "easy" and "hard" axes for magnetizing the free layer 452. For example, in certain embodiments, an MTJ 450 with a perpendicular magnetic anisotropy for the free layer 452 may have an "easy" axis in the perpendicular direction for the free layer 452, so that perpendicular magnetization for the free layer 452 is energetically favorable. A measurement of magnetic anisotropy may be the size of a field applied along the "hard" axis (e.g., in an in-plane direction) sufficient to cancel out the magnetization in the "easy" axis. Other or further measurements of magnetic anisotropy may similarly correspond to a difference between "easy" and "hard" axes. In various embodiments, a perpendicular magnetic anisotropy for a free layer 452 may refer to a magnetic anisotropy such that the "easy" axis is in the perpendicular direction (e.g., at right angles to the barrier layer 454), substantially in the perpendicular direction, more in the perpendicular direction than in the in-plane direction, or the like.

As described above, increasing or decreasing the perpendicular magnetic anisotropy of the free layer 452 (or of the ferromagnetic layers 402 within the composite free layer 452) may correspondingly increase or decrease the thermal stability of the MTJ 450. However, in certain embodiments, the write voltage or write current (e.g., a voltage or current sufficient to switch the magnetic moment of the free layer 452) may also depend on the perpendicular magnetic anisotropy of the free layer 452, such that increasing the perpendicular magnetic anisotropy to provide stability also increases the write voltage or write current. In general, the perpendicular magnetic anisotropy of the free layer 452 may correspond to the difficulty of switching the magnetic moment of the free layer 452, for inadvertent thermal switching (e.g., errors) and for deliberate switching (e.g., writing data) alike. Thus, a free layer 452 with a high perpendicular magnetic anisotropy may provide stable data storage, but may use high write currents and write voltages. By contrast, a free layer 452 with a lower perpendicular magnetic anisotropy may use lower write currents, but with a loss of stability.

The one or more anisotropy inducer layers 404, in certain embodiments, may be configured to induce an in-plane magnetic anisotropy for the composite free layer 452 in response to a perpendicular bias voltage, or a perpendicular write (e.g. a voltage difference between terminal T1 422 and terminal T2 424, or a current between terminal T1 422 and terminal T2 424). In various embodiments, inducing an in-plane magnetic anisotropy for the composite free layer 452 may refer to increasing an in-plane component of the magnetic anisotropy, tilting the "easy" axis to be more in the in-plane direction, or the like. In certain embodiments, an induced in-plane magnetic anisotropy may refer to or be based on an effective magnetic field experienced by a moving electron.

In certain embodiments, the perpendicular magnetic anisotropy $H_k$ for the composite free layer 452 may refer to the size of an in-plane magnetic field sufficient to cancel out the perpendicular magnetization of the composite free layer 452. As described above, the thermal stability, write voltage and write current for the MTJ 450 may be proportional to the perpendicular magnetic anisotropy $H_k$ for the composite free layer 452. In further embodiments, however, inducing an in-plane magnetic anisotropy in response to a write bias voltage or a write current may reduce $H_k$ while the bias voltage or current is applied, thus reducing the voltage level or the amount of current used to switch the state of the free layer 452. Accordingly, in certain embodiments, an MTJ 450 may provide a high perpendicular magnetic anisotropy $H_k$ in the absence of a write voltage or current, thus providing high thermal stability and good data retention, and may provide a reduced $H_k$ when the write voltage or current is applied, to facilitate writing.

In one embodiment, an anisotropy inducer layer 404 may include a built-in in-plane electric field (E) 442. For example, in FIG. 4, an E field 442 is depicted pointing into the page, in one of the in-plane directions. A "built-in" field for a layer may refer to any field that is not externally applied, or that remains in the absence of an external field. For example, built-in electric fields may exist in materials where charge distribution is asymmetric due to crystal asymmetry, permanent or quasi-permanent polarization, recombination of electrons and holes at a P-N junction, or the like.

In certain embodiments, an anisotropy inducer layer 404 may induce an in-plane magnetic anisotropy by spin-orbit coupling between a built-in in-plane electric field 442 and a perpendicular bias current based on a perpendicular bias voltage. In FIG. 4, the perpendicular direction is vertical on the page, so a perpendicular bias voltage may refer to any voltage difference between terminal T1 422 and terminal T2 424. Similarly, a perpendicular bias current or write current may refer to any current from terminal T1 422 to terminal T2 424, or in the opposite direction, from terminal T2 424 to terminal T1 422.

In various embodiments, spin-orbit coupling may refer to an effect that couples an electron's motion (e.g., orbital angular momentum relative to a nucleus, linear momentum in an electrical current, or the like) to the electron's spin. For electrons moving at relativistic speeds, an electric field in the lab frame (e.g., the rest frame of the MTJ 450) may be equivalent to a magnetic field in the rest frame of the electron. The equivalent magnetic field may exert torque on electron spin through the Zeeman interaction. The equivalent magnetic field due to spin-orbit coupling is proportional to the magnitude of the electric field and to the electron's momentum, and is at right angles to both.

Thus, applying a perpendicular bias voltage (e.g., a voltage difference between terminal T1 422 and terminal T2 424) results in a bias current with a perpendicular electron momentum, which interacts with the built-in in-plane electric field 442 as if it were a magnetic field. In FIG. 4, the equivalent magnetic field (H) 446 is depicted as being in the left or right direction: current between terminal T1 422 and terminal T2 424 in one direction would interact with the built-in in-plane electric field 442 pointed into the page as if it were a magnetic field 446 pointed left, and current between terminal T1 422 and terminal T2 424 in the opposite direction would interact with the built-in in-plane electric field 442 pointed into the page as if it were a magnetic field 446 pointed right. The magnetic field 446 may be referred to as an "equivalent" or "effective" magnetic field, indicating that it is a relativistic equivalent experienced by moving electrons, not an independent field from the built-in electric field 442. However, the interaction of the effective magnetic field 446 with the moving electrons (e.g., spin-orbit coupling) may be observed in the lab frame, or the rest frame of the MTJ 450, as an induced in-plane magnetic anisotropy.

Thus, in various embodiments, a composite free layer 452 may include one or more ferromagnetic layers 402 with high perpendicular magnetic anisotropy, so that the overall magnetic moment (M) 444 of the free layer 452 is perpendicular, with high thermal stability, and may include one or more anisotropy inducer layers 404 with a built-in in-plane electric field 442, so that a perpendicular voltage or current interacts with the built-in in-plane electric field 442 to induce an in-plane magnetic anisotropy and reduce the thermal stability during writing.

In various embodiments, an anisotropy inducer layer 404 may be configured with a built-in in-plane electric field 442 in various ways. For example, in certain embodiments, the built-in electric field 442 may be due to lateral structural asymmetry in the anisotropy inducer layer 404. In certain embodiments, lateral structural asymmetry may include lateral crystal asymmetry, in which charges are asymmetrically distributed within a crystalline material. Various semi-metallic materials may exhibit built-in electric fields 442 due to lateral crystal asymmetry. Additionally, certain transition metal dichalcogenides, such as tungsten ditelluride ($WTe_2$), molybdenum disulfide ($MoS_2$), tantalum diarsenide ($TaAs_2$), and niobium diantimonide ($NbSb_2$) have been found to exhibit built-in electric fields 442 due to lateral crystal asymmetry. Various transition metal dichalcogenides other than the examples provided, and various other semimetals may also be found to exhibit built-in electric fields 442 due to lateral crystal asymmetry. In certain embodiments, therefore, one or more anisotropy inducer layers 404 may include semi-metallic material. In further embodiments, one or more anisotropy inducer layers 404 may include transition metal dichalcogenides. In some embodiments, one or more anisotropy inducer layers 404 may include tungsten ditelluride ($WTe_2$), molybdenum disulfide ($MoS_2$), tantalum diarsenide ($TaAs_2$), and/or niobium diantimonide ($NbSb_2$).

In certain embodiments, a thickness of an anisotropy inducer layer 404 may be configured so that exchange coupling across the anisotropy inducer layer 404 maintains uniform (or substantially uniform) magnetization across the one or more ferromagnetic layers 402. For example, in various embodiments, a thin anisotropy inducer layer 404 may allow a ferromagnetic layer 402 above the anisotropy inducer layer 404 and a ferromagnetic layer 402 below the anisotropy inducer layer 404 to magnetically interact so that the magnetization of the ferromagnetic layers 402 is consistent. Additionally, a sufficiently thin anisotropy inducer layer 404 may, in certain embodiments, reduce or avoid interference with the spin-polarization of the write current, so that the spin polarization affects multiple ferromagnetic layers 402 in the composite free layer 452. In certain embodiments, the thickness of an anisotropy inducer layer 404 may be less than or equal to the thickness of the barrier layer 454. For example, in various embodiments, the thickness of an anisotropy inducer layer 404 may be 20 angstroms or less. In some embodiments, the thickness of an anisotropy inducer layer 404 may be 10 angstroms or less.

As described above, with reference to the memory cell 350 of FIG. 3, the MTJ 450 in the depicted embodiment is a spin-transfer torque (STT) MTJ, which stores data based on the magnetic moment 444 of the free layer 452. In a further embodiment, the magnetic moment 444 of the free layer 452 is switchable by a write current through the fixed layer 456 and the free layer 452. For example, in one embodiment, a current between terminal T1 422 and T2 424 in one direction may set the MTJ 450 into the parallel state, and a current between terminal T1 422 and T2 424 in the other direction may set the MTJ 450 into the antiparallel state.

Reading data from the MTJ 450 may also involve passing a current through the MTJ 450, between terminal T1 422 and T2 424, to sense whether the resistance of the MTJ 450 corresponds to the parallel state or the antiparallel state. Although read current and write current may be along the same current path in certain embodiments, a "write current" may more specifically refer to a current sufficient to switch the free layer 452 between parallel and antiparallel states. For example, a current threshold may refer to a value for the electrical current such that a current that satisfies the threshold (e.g., a current with a magnitude above the threshold value) is sufficient to switch the free layer 452 between parallel and antiparallel states. In a further embodiment, a current that does not satisfy the threshold (e.g., a current with a magnitude below the threshold value) may be used for reading instead of for writing.

In certain embodiments, the in-plane magnetic anisotropy induced by the one or more anisotropy inducer layers 404 may reduce the magnitude of the write current used for switching the magnetic moment 444 of the free layer 452, in comparison to a write current for a comparable MTJ 450 without anisotropy inducer layers 404, or to the MTJ 450 with the one or more anisotropy inducer layers 404 omitted. As described above, when a perpendicular write current is present (e.g., when a perpendicular bias voltage is applied), the built-in in-plane electric field 442 may be equivalent, in the relativistic reference frame of the write current electrons, to an in-plane magnetic field 446, resulting in an induced in-plane magnetic anisotropy. In certain embodiments, the in-plane magnetic anisotropy induced by an anisotropy inducer layer 404 may reduce the perpendicular magnetic anisotropy $H_k$ for the composite free layer 452 as a function of the bias voltage V so that $H_k(V)=H_{k0}*(1-\beta*|V|/H_{k0})^2$, where $H_{k0}$ is the value of the perpendicular magnetic anisotropy $H_k$ in the absence of a bias voltage or current, and $\beta$ is a parameter characterizing the magnitude of the effect.

In certain embodiments, the write current used for switching the magnetic moment 444 of the free layer 452 (e.g., a write current threshold), or the bias voltage sufficient for switching the magnetic moment 444 of the free layer 452 (e.g., a bias voltage threshold), may be proportional to the perpendicular magnetic anisotropy $H_k$ of the free layer 452. Accordingly, in certain embodiments, the in-plane magnetic anisotropy induced by an anisotropy inducer layer 404 may reduce the magnitude of the write current used for switching the magnetic moment 444 of the free layer 452, by reducing the perpendicular magnetic anisotropy $H_k$ of the free layer 452. For example, in certain embodiments, a write current, write current threshold, bias voltage threshold, or the like, may be reduced by a factor of $(1-\beta*|V|/H_{k0})^2$ in comparison to a write current for a comparable MTJ 450 without anisotropy inducer layers 404.

In various embodiments, the thermal stability of the MTJ 450 may similarly be reduced (e.g., by the same factor) by the induced in-plane magnetic anisotropy. Additionally, in certain embodiments, the reduction in thermal stability for the MTJ 450 may be temporary. For example, in one embodiment, during a write operation, when the bias voltage or current is present, the in-plane magnetic anisotropy is induced, and the thermal stability is reduced, facilitating writing. However, in a further embodiment, the thermal stability may be at a higher, non-reduced value during a data retention time after the data is written (e.g., before it is read), when the bias voltage or current is absent, and the in-plane magnetic anisotropy is not induced. Thus, in various embodiments, the one or more anisotropy inducer layers 404 may provide lower thermal stability during write operations, to facilitate writing, and may provide higher thermal stability during data storage, to avoid errors that might otherwise occur due to thermal fluctuations.

In certain embodiments, the in-plane magnetic anisotropy induced by an anisotropy inducer layer 404 may reduce the magnitude of the write current used for switching the magnetic moment 444 of the free layer 452 symmetrically, for both positive and negative values of the bias voltage. For example, where the reduction in the perpendicular magnetic anisotropy $H_k$ of the free layer 452, the thermal stability, and the write current is by a factor of $(1-\beta^*|V|/H_{k0})^2$, as described above, the reduction factor depends on the absolute value of the bias voltage, and therefore is the same for applied voltages of the same magnitude, whether the applied voltage is positive (e.g., terminal T1 422 at a higher voltage than terminal T2 424) or negative (e.g., terminal T1 422 at a lower voltage than terminal T2 424).

In one embodiment, a composite free layer 452 may comprise a single anisotropy inducer layer 404. For example, in the depicted embodiment in FIG. 4, the composite free layer 452 has one anisotropy inducer layer 404. In another embodiment, however, a composite free layer 452 may comprise a plurality of anisotropy inducer layers 404.

Figure 5:
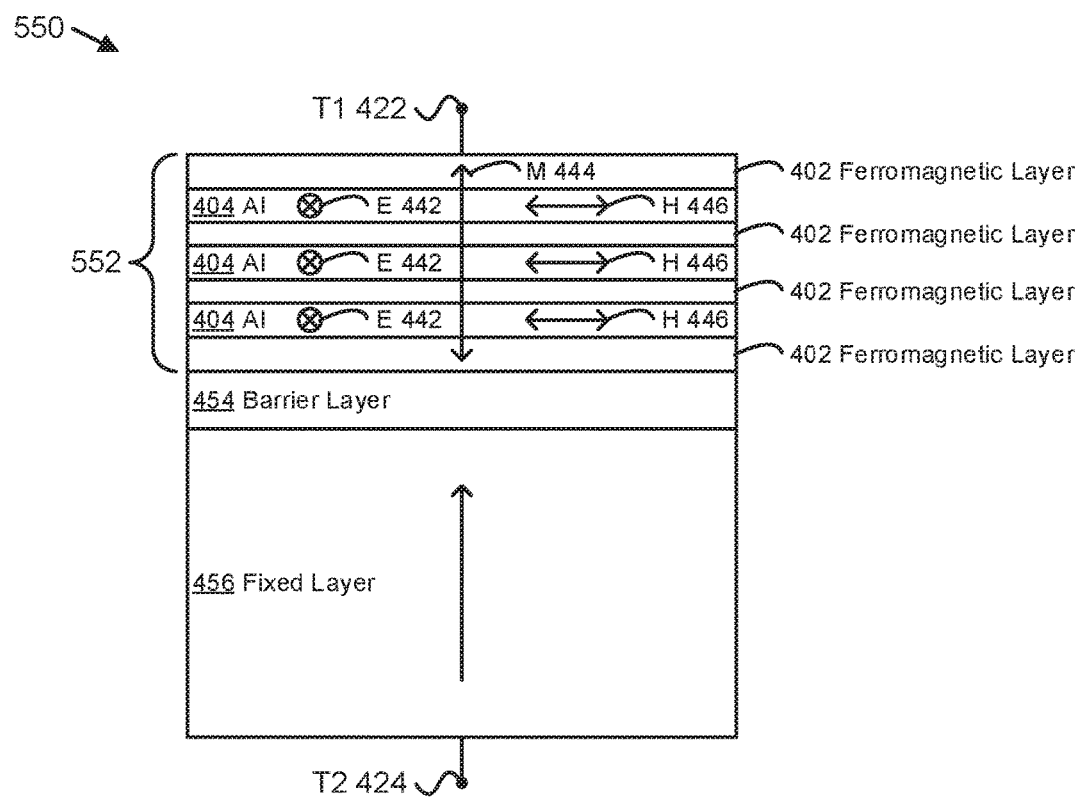
FIG. 5 is a schematic block diagram illustrating another embodiment of a magnetic tunnel junction comprising a composite free layer.

FIG. 5 depicts another embodiment of a magnetic tunnel junction 550 comprising a composite free layer 552. The MTJ 550, in various embodiments, may be substantially similar to the MTJ 450 and the memory cell 350 described above, including a free layer 552, a barrier layer 454, and a fixed layer 456, which may be substantially as described above with regard to FIGS. 3 and 4. In the depicted embodiment, the free layer 552 is a composite free layer, comprising one or more ferromagnetic (F) layers 402 and one or more anisotropy inducer (AI) layers 404, which may be substantially as described above.

However, in the depicted embodiment, the composite free layer 552 includes a plurality of anisotropy inducer layers 404 alternating with the ferromagnetic layers 402 in a superlattice structure. In various embodiments, a superlattice structure may refer to a periodic or repeating structure of layers. For example, in the depicted embodiment, three anisotropy inducer layers 404 alternate with four ferromagnetic layers 402 to form a superlattice structure. In another embodiment, a superlattice structure may include more or fewer layers than in the depicted embodiment.

In the depicted embodiment, each of the anisotropy inducer layers 404 may induce an in-plane magnetic anisotropy in response to a perpendicular bias voltage or current, and the resulting reduction of the perpendicular magnetic anisotropy $H_k$ for the composite free layer 552, the write current threshold, the thermal stability, and the like may be by a factor of $(1-\beta_{eff}^*|V|H_{k0})^2$, similar to the factor of $(1-^*|V|/H_{k0})^2$ described above for a single anisotropy inducer layer 404, but where $\beta_{eff}$ is a sum of individual $\beta$ values for the individual anisotropy inducer layers 404. Additionally, the anisotropy inducer layers 404 may still be sufficiently thin for exchange coupling among individual ferromagnetic layers 402 to maintain uniform (or substantially uniform magnetization) across the set of ferromagnetic layers 402

Figure 6:
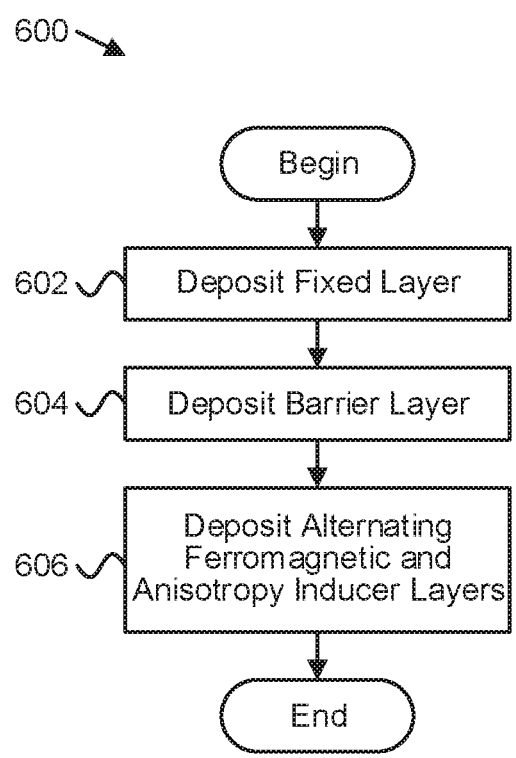
FIG. 6 is a schematic flow chart diagram illustrating one embodiment of a method for making a magnetic tunnel junction.

FIG. 6 is a schematic flow chart diagram illustrating one embodiment of a method 600 for making a magnetic tunnel junction 450. The method 600 begins, and a manufacturer deposits 602 a fixed layer 456. The fixed layer 456 may be deposited on a substrate, a CMOS control layer, a metallic interconnect layer, a seed layer, or the like. The manufacturer deposits 604 a barrier layer 454 on the fixed layer 456. The manufacturer deposits 606 one or more ferromagnetic layers 402 alternating with one or more anisotropy inducer layer(s) 404 on the barrier layer 454, and the method 600 ends.

A means for storing data in a composite free layer 452 for a magnetic tunnel junction 450, based on an orientation of a perpendicular magnetic moment for the composite free layer 452, in various embodiments, may include a magnetic tunnel junction 450, a fixed layer 456, a barrier layer 454, a composite free layer 452, one or more ferromagnetic layers 402, a ferromagnetic material, a ferromagnetic alloy, a CoFeB alloy, or the like. Other embodiments may include similar or equivalent means for storing data in a composite free layer 452.

A means for symmetrically inducing an in-plane magnetic anisotropy for a composite free layer 452 in response to positive and negative values of a perpendicular bias voltage, in various embodiments, may include a single anisotropy inducer layer 404, a plurality of anisotropy inducer layers 404, a built-in in-plane electric field 442, a material with lateral structural asymmetry causing a built-in in-plane electric field 442, a semi-metallic material, a transition metal dichalcogenide, tungsten ditelluride ($WTe_2$), molybdenum disulfide ($MoS_2$), tantalum diarsenide ($TaAs_2$), niobium diantimonide ($NbSb_2$), or the like. Other embodiments may include similar or equivalent means for symmetrically inducing an in-plane magnetic anisotropy.

A means for supplying a perpendicular bias voltage, in various embodiments, may include a die controller 206, row circuits 202, column circuits 204, word lines 302, bit lines 304, voltage generating components such as voltage drivers and/or level, voltage switching components such as transistors, or the like. Other embodiments may include similar or equivalent means for supplying a perpendicular bias voltage.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a magnetic tunnel junction for storing data, the magnetic tunnel junction comprising a fixed layer, a barrier layer, and a composite free layer, the barrier layer disposed between the fixed layer and the composite free layer, the composite free layer comprising:
    one or more ferromagnetic layers;
    one or more anisotropy inducer layers that induce an in-plane magnetic anisotropy for the composite free layer in response to a perpendicular bias voltage.

2. The apparatus of claim 1, wherein the magnetic tunnel junction is a spin-transfer torque magnetic tunnel junction that stores data based on a magnetic moment of the free layer, wherein the magnetic moment of the free layer is switchable by a write current through the fixed layer and the free layer.

3. The apparatus of claim 2, wherein the induced in-plane magnetic anisotropy reduces the magnitude of the write current used for switching the magnetic moment of the free layer.

4. The apparatus of claim 3, wherein the reduction in the write current is symmetric for positive and negative values of the bias voltage.

5. The apparatus of claim 1, wherein a magnetic moment of the fixed layer and a magnetic moment of the composite free layer are perpendicular to the barrier layer.

6. The apparatus of claim 1, wherein the composite free layer comprises a single anisotropy inducer layer.

7. The apparatus of claim 1, wherein the composite free layer comprises a plurality of anisotropy inducer layers alternating with the ferromagnetic layers in a superlattice structure.

8. The apparatus of claim 1, wherein an anisotropy inducer layer comprises a built-in in-plane electric field.

9. The apparatus of claim 8, wherein the built-in electric field is due to lateral structural asymmetry in the anisotropy inducer layer.

10. The apparatus of claim 8, wherein the in-plane magnetic anisotropy is induced by spin-orbit coupling between the built-in in-plane electric field and a perpendicular bias current based on the perpendicular bias voltage.

11. The apparatus of claim 1, wherein the one or more anisotropy inducer layers comprise semi-metallic material.

12. The apparatus of claim 1, wherein the one or more anisotropy inducer layers comprise transition metal dichalcogenides.

13. The apparatus of claim 1, wherein the one or more anisotropy inducer layers comprise one or more of tungsten ditelluride, molybdenum disulfide, tantalum diarsenide, and niobium diantimonide.

14. The apparatus of claim 1, wherein a thickness of an anisotropy inducer layer is configured such that a magnetization of the composite free layer, in the absence of a bias voltage, is consistent across the one or more ferromagnetic layers.

15. A system comprising:
a magnetoresistive random access memory (MRAM) die, the MRAM die comprising a plurality of memory cells, each memory cell comprising a reference layer, a barrier layer, and a composite free layer, the barrier layer disposed between the reference layer and the composite free layer, the composite free layer comprising:
one or more ferromagnetic layers;
one or more anisotropy inducer layers alternating with the one or more ferromagnetic layers, the one or more anisotropy inducer layers configured to induce an in-plane magnetic anisotropy for the composite free layer in response to a perpendicular write current.

16. The system of claim 15, wherein the MRAM die further comprises peripheral circuits that bias word lines and bit lines coupled to the memory cells to supply the write current.

17. The system of claim 15, wherein a thermal stability of the memory cells is temporarily reduced during a write operation by the induced in-plane magnetic anisotropy.

18. The system of claim 15, wherein the memory cells store data in response to the write current satisfying a threshold, and the induced in-plane magnetic anisotropy reduces the threshold.

19. An apparatus comprising:
means for storing data in a composite free layer for a magnetic tunnel junction, based on an orientation of a perpendicular magnetic moment for the composite free layer; and
means for symmetrically inducing an in-plane magnetic anisotropy for the composite free layer in response to positive and negative values of a perpendicular bias voltage.

20. The apparatus of claim 19, further comprising means for supplying the perpendicular bias voltage.

* * * * *